United States Patent [19]

Clinton

[11] Patent Number: 4,952,880

[45] Date of Patent: Aug. 28, 1990

[54] APPARATUS FOR TESTING AND COUNTING FLAWS IN THE INSULATION OF AN ELECTRICAL CONDUCTOR PASSING THROUGH AN ELECTRODE

[76] Inventor: Henry H. Clinton, 10 Shore Rd., Clinton, Conn. 06413

[21] Appl. No.: 328,257

[22] Filed: Mar. 28, 1989

[51] Int. Cl.⁵ .................. G01R 31/02; G01R 31/12
[52] U.S. Cl. .................................................. 324/544
[58] Field of Search ............... 324/541, 544, 551, 536

[56] References Cited

U.S. PATENT DOCUMENTS

| | | | |
|---|---|---|---|
| 3,418,570 | 12/1968 | Clinton | 324/515 |
| 3,510,763 | 5/1970 | Clinton | 324/544 |
| 3,986,107 | 10/1976 | Dickson et al. | 324/551 |
| 4,140,964 | 2/1979 | Eubank et al. | 324/551 |

Primary Examiner—Reinhard J. Eisenzopf
Assistant Examiner—Maura K. Regan
Attorney, Agent, or Firm—McCormick, Paulding & Huber

[57] ABSTRACT

Apparatus for testing and counting flaws in the insulation of an electrical conductor includes an oscillator for generating an alternating test voltage which is used with an electrode to apply a hight test voltage to the insulation of a conductor passing through an electrode wherein the test voltage arcs to the current carrying conductor through an imperfection or flow in the insulation. A fault detection circuit uses a negative threshold voltage upon which the peaks of the alternating test voltage ride and includes a peak rectifying circuit which rectifies the positive excursions of a ringing signal inpressed on the peaks of the test voltage to produce a fault present voltage signal. The oscillator is part of a control loop which includes a full wave precision AC-to-DC converter which provides an output signal to an amplitude controller circuit which adjusts and maintains the magnitude of the alternating test voltage produced by the oscillator at a desired preset value.

8 Claims, 6 Drawing Sheets

APPARATUS FOR TESTING AND COUNTING FLAWS IN THE INSULATION OF AN ELECTRICAL CONDUCTOR PASSING THROUGH AN ELECTRODE

BACKGROUND OF THE INVENTION

The present invention relates generally to fault testing of insulation applied to a cable, wire or other elongated electrical conductor and deals more particularly with insulation testing apparatus of the type wherein a high test voltage is applied between the insulation and the conductor to reveal holes, voids or other imperfections in the insulation.

Insulated electrical conductors, such as wire or cable, are usually subjected to a high voltage test prior to use as a check against any unseen imperfections which may be present in the insulation. This test may be made either as the insulation is extruded onto the conductor or may be performed in some subsequent operation. Generally, the insulated conductor, which is suitably grounded, is passed through an electrode of some kind which applies a high voltage to the outer surface of the insulation. Typically, the test voltage may be an alternating voltage or a direct or unidirectional test voltage. In either case, the test voltage produces a spark or arc upon the appearance of an imperfection at the electrode. In addition, the testing apparatus generally includes a counter, alarm and/or other indicator or control which is operated in response to the appearance of such an arc.

In my U.S. Pat. No. 3,418,570 issued Dec. 24, 1968 entitled ELECTRICAL DEVICE FOR TESTING FOR AND COUNTING FLAWS IN THE INSULATION OF AN ELECTRICAL CONDUCTOR PASSING THROUGH AN ELECTRODE, apparatus is disclosed which overcomes a number of drawbacks related to the speed of movement of the conductor through the electrode, multiple flaw counts and damage to the insulation under test, some or all of which drawbacks are associated with prior art devices. Reference may be had to the above-referenced patent for a detailed description of the operation and construction of the testing device and which disclosure is incorporated herein by reference.

Despite the improvements in testing the insulation of an electrical conductor with the apparatus disclosed in the above-referenced patent, the testing apparatus exhibits a number of drawbacks which are overcome by the present invention and which are described below.

One drawback of the prior testing apparatus is the low efficiency of the oscillator circuit which tends to limit the output power, and accordingly, distort the sinusoidal output wave-form used to produce the test voltage.

Another drawback is that the frequency of the oscillator tends to shift to a high radio frequency when the oscillator and the high voltage transformer were separated by any appreciable distance result of such to the magnitude of the high voltage output drops to a low value impairing the operation of the apparatus as a flaw detector.

Another drawback associated with the prior testing apparatus is its use of power loss as a fault criterion. Since power loss could occur under a number of conditions including, an arc through a flaw; the power lost through corona discharge and power loss within the insulation of the conductor under test, false fault indications could be recorded.

A further drawback of the prior test apparatus is the resultant damage to the oscillator electronic components, the voltage regulator and the DC power supply of the apparatus when long intervals of bare wire pass through the electrode, or when the conductor under test remains stationary in the electrode for a sufficient time to destroy the insulation. Under these and other conditions, the oscillator circuit ceases to operate and excessive power is consumed.

A further drawback associated with the above-referenced prior testing device was that the oscillator output voltage is not a linear function of the applied direct voltage, particularly at low voltages. Since the relationship of the oscillator output voltage to the applied direct voltage is part of the output voltage control loop, control loop oscillations tend to occur at low output voltages. This problem is compounded since control loop gain is varied to achieve a desired output voltage control with the result that output voltages of less than 20% of full scale cannot be achieved.

It is desirable therefore to overcome the drawbacks and limitations generally associated with AC and unidirectional current testing apparatus such as the prior testing apparatus described above and to further provide improvements over the limitations in the testing apparatus disclosed in the above-referenced patent.

It is therefore a general aim of the present invention to provide an improved apparatus for testing and counting flaws in the insulation of an electrical conductor passing through an electrode by providing an oscillator circuit having a high efficiency and a very linear relationship between the applied direct voltage and AC output voltage at and including very low voltage levels.

It is also an object of the present invention to provide testing apparatus which utilizes a control loop wherein operation is possible over substantially a 150 to 1 ratio of voltages without control loop oscillation.

It is a further object of the present invention to permit the high voltage transformer associated with the apparatus to be located several hundred feet from the oscillator without introducing instability due to radio frequency parasitic oscillations.

It is a yet further object of the present invention to provide a control loop wherein constant gain is maintained as the magnitude of the output voltage is varied to limit the direct current supplied to the oscillator when a short circuit condition is sustained in the electrode.

SUMMARY OF THE INVENTION

Apparatus for testing and counting flaws in the insulation of an electrical conductor passing through an electrode is presented in accordance with the present invention wherein a high frequency alternating test voltage is generated by an oscillator and is used with an electrode through which an insulated conductor is passed with a continuous motion so that the test voltage is applied to the portion of the insulation instantaneously received in the electrode. A desired magnitude of test voltage is produced by the oscillator in response to a controller circuit which is used to adjust and maintain the magnitude of the test voltage at a preset desired value. In accordance with the present invention, a full wave precision AC-to-DC converter is coupled to the oscillator and to the controller circuit such that the controller circuit causes the magnitude of the oscillations to increase or decrease in accordance with the magnitude of the control loop voltage.

In accordance with another aspect of the invention, a fault detection circuit includes a negative threshold voltage circuit which produces a voltage having a negative magnitude whereby the peaks of the alternating test voltage signal ride at the magnitude. When a fault condition occurs, the test voltage arcs to the conductor and impresses a series of fast-rise pulses on the peaks of the alternating test voltage signal. The positive excursion of the fast-rise pulses resulting from an arc in the electrode on the peaks above the negative threshold value is rectified and produces a voltage pulse signal representative of the occurrence of a fault condition.

BRIEF DESCRIPTION OF THE DRAWINGS

Other features and advantages of the present invention will become readily apparent from the following written description taken in conjunction with the following drawings wherein.

DETAILED DESCRIPTION OF PREFERRED EMBODIMENTS

Figures 1, 2:
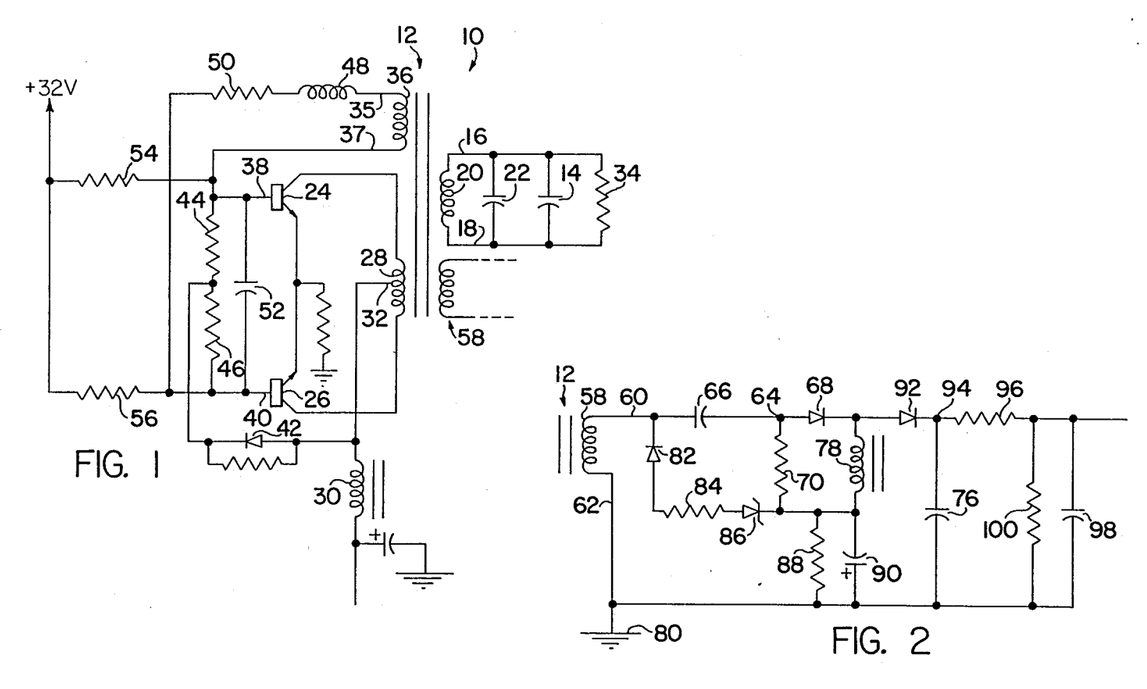
FIG. 1 is an electrical circuit schematic diagram of the oscillator used in the insulation testing apparatus embodying the present invention.
FIG. 2 is an electrical circuit schematic diagram of the fault detector used in the insulating testing apparatus embodying the present invention.

Turning now to the drawings and considering the invention in further detail, FIG. 1 is an electrical circuit schematic diagram of the oscillator utilized in the insulating testing apparatus and is generally designated 10. The circuit 10 includes a high voltage transformer 12 having a high voltage secondary winding 20 with ends 16, 18. The transformer 12 has an antiresonant frequency of approximately 3,000 hertz with a load capacitance 14 connected across the ends 16, 18. The load capacitance 14 is representative of the capacitance developed between a test electrode and an insulated conductor under test as illustrated schematically in FIG. 4. A second capacitance 22 is also connected between the ends 16, 18 of the transformer secondary winding 20 and is representative of the distributed capacitance of the transformer secondary winding. The Q of this antiresonant combination is relatively high and on the order of a magnitude of 50.

The oscillator circuit 10 further includes transistors 24 and 26 arranged in a "push-pull" operating mode such that one transistor is in a fully conductive state while the other is in a cut-off state during one half of the oscillating cycle and with the transistors assuming opposite conductive states during the other half of the oscillating cycle. It will be recognized that a square wave is developed across the collector-to-emitter of each transistor. The imposition of a square wave on an antiresonant tuned circuit causes large heat losses in the transistors and in the transformer. A sinusoidal waveform rather than a square wave is therefore desired to be impressed across the primary winding 28 of the transformer 12 and an inductor or choke 30 having a constant current characteristic is connected to the center tap 32 of the primary winding 28 to absorb the difference in the two waveforms to produce the desired sinusoidal waveform. One feature of the oscillator of the present invention is the greatly improved efficiency achieved as a result of not impressing the square wave generated on the antiresonant tuned circuit. Accordingly, utilization of the inductor 30 reduces the direct current necessary to supply a given power to a load resistance 34 connected across the ends 16, 18 of the secondary winding 20 of the transformer 12. A winding 36 of the transformer 12 has ends 35 and 37 coupled to the respective bases 38, 40 of the transistors 24 and 26 to provide positive feedback to produce oscillation. The drive current is provided from a voltage regulator (illustrated in FIG. 4) through a series circuit including inductor 30, diode 42, resistor 44 and resistor 46, the feedback winding 36, inductor 48 and resistor 50.

A low pass filter including the inductor 48 and a capacitor 52, which is connected between the bases 38 and 40 of the transistors 24 and 26 respectively, is used to prevent radio frequency parasitic oscillations. The parasitic oscillations may be caused by transformer leakage reactance or by mutual coupling between the various circuit components such as those that occur when a long connecting cable is used between the transistors 24 and 26 and the transformer 12. Therefore, an important feature of the invention is the stability of the oscillator when distances up to several hundred feet are introduced between the high voltage transformer used for testing and the oscillator circuit components.

The oscillator circuit 10 of FIG. 1 is able to maintain oscillation at low input voltages on the order of hundred of millivolts. The diode 42 is not able to conduct when the DC supply voltage from the voltage regulator falls below 1.2 volts and forward bias current flows through the resistors 54 and 56 which are connected to the bases 38 and 40 of the transistors 24 and 26 to maintain the bases in conduction. The low voltage biasing arrangement maintains oscillation at input voltages as low as 200 millivolts DC and produces a linear relationship between the DC voltage input and the high voltage output. Accordingly, when the oscillator 10 is included in an output amplitude control loop, the range of control of the oscillator output is extendable to low voltages without experiencing control loop oscillation.

Figure 3A:
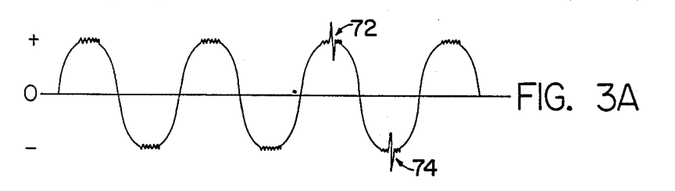
FIGS. 3a-3e are representative electrical signal waveforms observed at specific locations in the fault detector circuit of FIG. 2.

Turning now to FIG. 2 and FIGS. 3a-3e, the fault detector utilized in the present invention is described. A winding 58 of the transformer 12 provides a lower magnitude voltage of the high voltage secondary waveform. The lower magnitude voltage waveform is illustrated in FIG. 3a and is taken across the ends 60 and 62 of the winding 58. The waveform of FIG. 3a is representative of a signal which would be present with an insulated conductor surrounded by a heavy corona wherein the corona signal is superimposed on the peaks of the sinusoidal voltage waveform. This superimposed signal is also impressed on the winding 58 due to the tight coupling of the windings of the transformer 12. The impressed signal appears at the end 60 of the winding 58 taken with respect to the junction of components made up of resistor 70, diode 86, resistor 88, capacitor 90 and inductor 78.

An insulation failure due to a small pinhole and the like generally produces a series of fast-rise pulses on the peaks of the sinusoidal waveform and such a representative pulse series is generally indicated at 72 and 74 in FIG. 3a. This signal is superimposed on both the basic sinusoidal test voltage waveform and the corona. The fault detector of the present invention detects this type of failure without being affected by corona discharge.

Figure 3B:
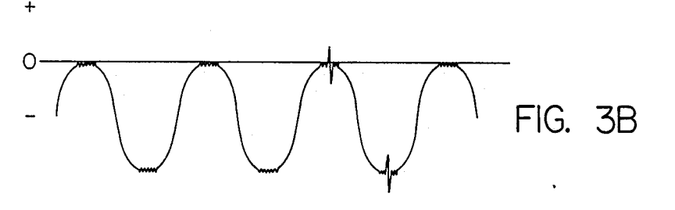

The fault detector of FIG. 2 includes a positive peak conducting rectifier made up of capacitor 66, resistor 70, diode 68, capacitor 76, and inductor 78. The RC time constant of capacitor 66 and resistor 70 is approximately 0.01 seconds or about 30 times the oscillation period. Thus, it will be seen that the diode 68 conducts very briefly at the positive tip of each input cycle with the capacitor 66 charging to nearly the peak value of the waveform. A representative voltage waveform across the resistor 70 is illustrated in FIG. 3b.

Figure 3C:
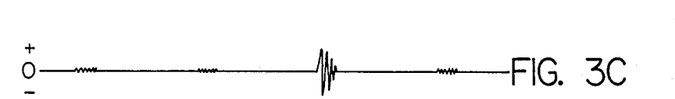
Figure 3D:
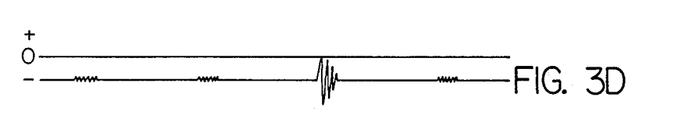

When the diode 68 conducts, current pulses flow through the inductor 78 causing it to generate a damped sinusoidal voltage at its self-resonant frequency which frequency is in the order of several megahertz. A representative damped sinusoidal waveform appearing across the inductor 78 is illustrated in FIG. 3c. A negative threshold voltage is generated at one side of the resistor 70 and inductor 78 with respect to the one end 62 of the winding 58 which end 62 is connected to a ground reference potential generally designated 80. The negative threshold voltage is produced by the series connection of diode 82, resistor 84 and zener diode 86, and the parallel combination of resistor 88 and the capacitor 90. When the waveform signal illustrated in FIG. 3c is measured with respect to the ground reference potential 80, the resultant waveform is illustrated in FIG. 3d. It will be observed that the threshold voltage is set through component value selection such that the magnitude of the fault signal will have a positive excursion only during a fault condition.

Figure 3E:
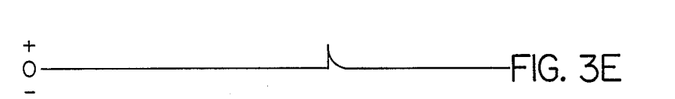

The anode of a diode 92 is connected to and in series with the diode 68 and the cathode is connected to a capacitor 76 which has its opposite terminal connected to ground reference 80. The diode 92 and capacitor 76 function as a peak rectifier during the positive excursions of the negative threshold signal illustrated in FIG. 3d and produces a waveform at the junction of the diode 92 and capacitor 76 generally designated 94 in the circuit of FIG. 2 and as illustrated in FIG. 3e. The signal produced by the peak rectifier is filtered by resistor 96 and capacitor 98 which are connected to the junction 94 to remove the high frequency components of the peak rectified signal. A resistor 100 connected between ground reference and resistor 96 provides a discharge path for the capacitor 76. The positive signal which appears across the resistor 100 is used to trigger a fault indicator circuit as described in the description of the preferred embodiment which follows.

Figures 4, 4A:
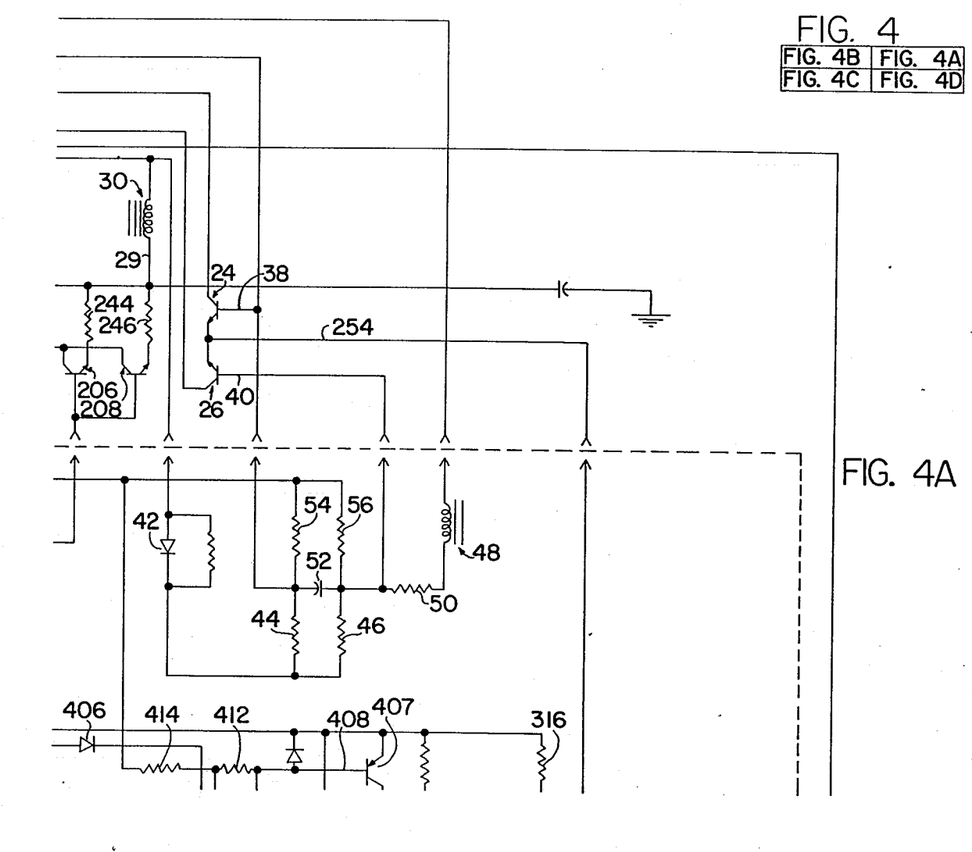
FIG. 4 is a block diagram showing the connections of FIGS. 4a-4d.
FIGS. 4a-4d show an electrical circuit schematic diagram of one embodiment of the insulation testing apparatus of the present invention and also includes a simplified perspective view of a conductor take-up reel and an electrode.
Figure 4B:
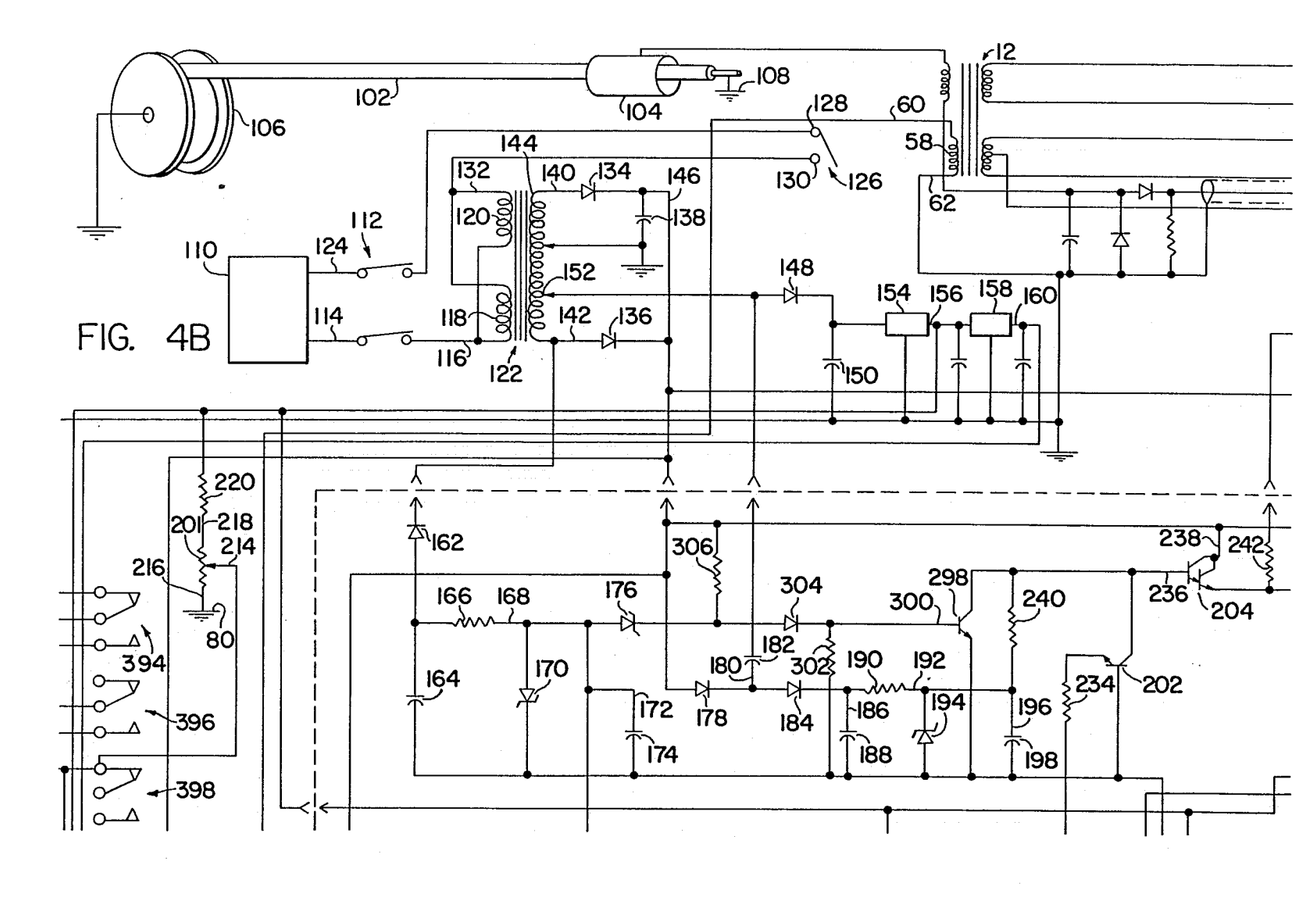
Figure 4C:
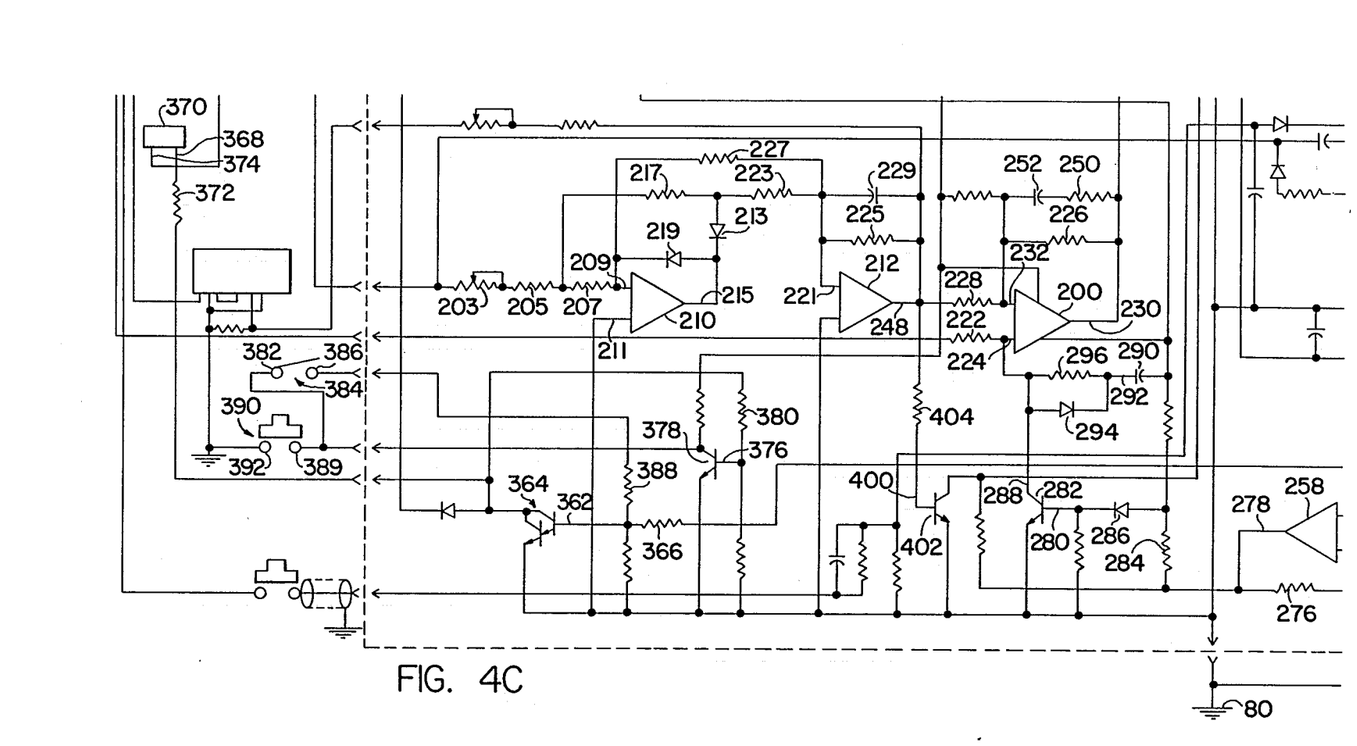
Figure 4D:
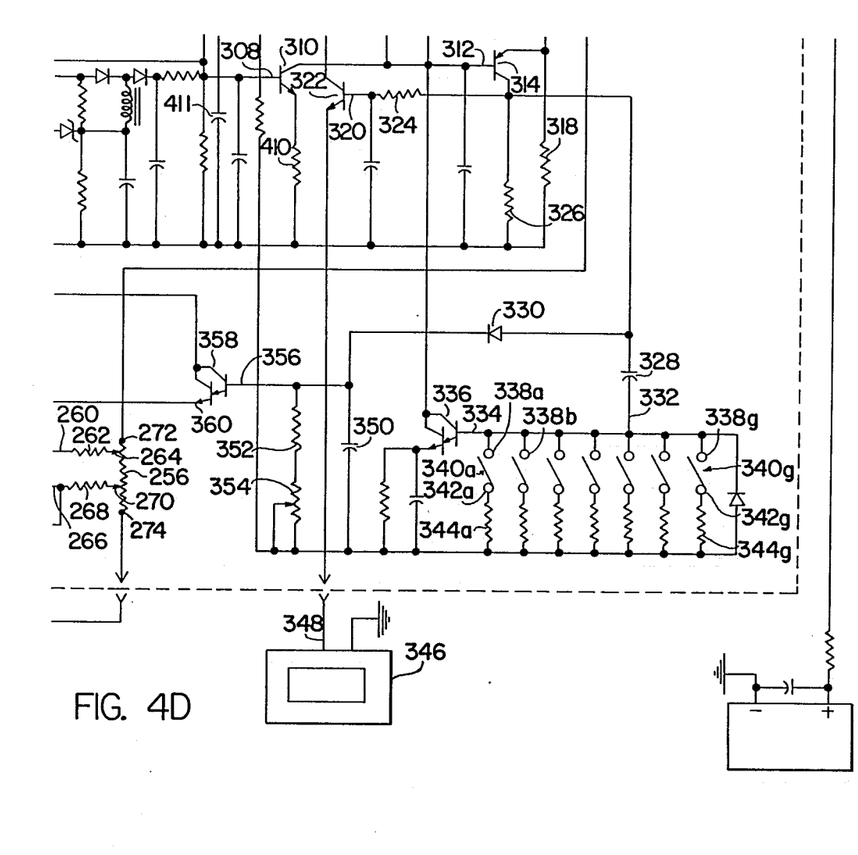

Turning now to a preferred embodiment of the present invention in which the oscillator circuit of FIG. 1 and the fault detector circuit of FIG. 2 are utilized, an electrical circuit schematic and diagram illustrating one embodiment of the present invention is illustrated in FIG. 4. The testing apparatus illustrated in FIG. 4 is intended to be used with an insulated electrical conductor 102 which is passed through a test electrode 104 and which conductor is shown being wound on a take up reel 106. The conductor 102 may be taken from an insulation extruding machine, a supply or payoff reel or other similar source well known to those skilled in the art. The actual conducting portion of the conductor 102 as illustrated in FIG. 4 may be grounded through the take-up reel 106 or, alternatively ground 108 may be applied to the payoff reel. Due to the use of a high frequency test voltage, however, the grounding of the conductor is not always necessary and may often be omitted when testing relatively large reels of conductor. The test electrode 104 may take various forms and for example, may be a generally conventional bead chain or flared mouth electrode or other form generally well known to those skilled in the art.

In the illustrated embodiment of FIG. 4, the various circuit components and parts of the testing device are shown arranged and interconnected and are usually contained within a protective enclosure (not shown). The apparatus is intended to be powered from a conventional 110 volts, 60 hertz power source generally designated 110 and is coupled to the apparatus through a double pole, single throw switch generally designated 112. One side 114 of the AC line is coupled to one side 116 of input windings 118 and 120 of a power transformer generally designated 122 where the input windings 118 and 120 are connected in parallel. The other side 124 of the AC line is coupled through the switch 112 to one side of an interlock switch generally designated 126. The switch 126 provides continuity across its terminals 128, 130 when the cover of the enclosure is in place to connect to the other side 132 of the input windings 118 and 120.

A full wave rectifier circuit includes diodes 134 and 136 and a capacitor 138 arranged in a well known manner across the ends 140, 142 of the output winding 144 of the power transformer 122. The cathodes of the diodes 134 and 136 are connected together and to one end of the capacitor 138 to provide an unregulated DC voltage on lead 146 and which voltage is preferably in the range of +32 volts DC. The DC voltage on lead 146 is used to power a voltage regulator and the oscillator circuit. A second rectifier circuit including diode 148 and capacitor 150 are connected such that the anode of the diode 148 is connected to a tap 152 on the output winding 144 of the power transformer 122. The output of the second rectifier formed by the cathode of the diode 148 and one end of the capacitor 150 are inputs to a semiconductor voltage regulator circuit generally designated 154 and which provides a nominal regulated +12 volts DC voltage at its output 156. The output 156 of the voltage regulator 154 is connected to the input of a second semiconductor voltage regulator generally designated 158 and which regulator 158 provides a nominal regulated +5 volt DC voltage at its output at 160. The regulated voltages from the voltage regulator 154 and 158 respectively are used to provide DC power for the various components comprising the circuitry of the present invention. The semiconductor regulators are well known to those in the art.

A third rectifier circuit includes a diode 162 which has its cathode connected to one end 142 of the output winding 144 of the power transformer 122. The anode of the diode 162 is connected to one end of a capacitor 164 and a resistor 166. The opposite end 168 of the resistor 166 is connected to the anode of a zener diode 170 and to one end 172 of a capacitor 174 and to the anode of a zener diode 176 to produce a negative regulated −12 volts DC to provide power for the various circuit components.

A fourth rectifier circuit includes a diode 178 having its anode connected to the lead 146 upon which lead a nominal +32 volts DC is present. The cathode of the diode 178 is connected to one end 180 of a capacitor 182 and to the anode of the diode 184. The cathode of the diode 184 is connected to one end 186 of a capacitor 188 and to one end of a resistor 190. The opposite end 192 of the resistor 190 is connected to the cathode of a zener diode 194 and to one end 196 of a capacitor 198 to produce a DC voltage of approximately +39 volts across the capacitor 198 and which voltage is used to increase the upper range of the oscillator voltage regulator which is described below.

The oscillator voltage regulator includes an operational amplifier 200, npn transistor 202, darlington transistor 204 and power transistors 206 and 208. Operational amplifiers 210 and 212 are connected as a full wave precision AC-to-DC converter and which converter is used in the control loop of the oscillator and to provide voltage input signals to operational amplifier 200.

The amplifier 210 has its non-inverting input 209 coupled to one end 60 of the winding 58 of transformer 12 through series resistors 207, 205, and variable resistance 203. The non-inverting input 211 is connected to ground reference potential 80. The operational amplifier 210 is an inverting amplifier and when a signal applied to its input 209 is positive, a diode 213 connected to the output 215 becomes forward biased and develops an output signal across the resistor 217. The gain of the amplifier 210 is the ratio of the resistor 217 to resistor 207. When the input signal becomes negative, the diode 213 becomes non-conductive and there is no output. However, a negative feedback path is provided through the diode 219 connected between the output 215 and input 209 which reduces the positive output voltage to +0.7 volts to prevent the amplifier from saturating.

The voltage signal at the output 215 of the amplifier 210 is coupled to the inverting input 221 of the amplifier 212 through a resistor 223 and the diode 213 to receive the half wave rectified signal produced by the amplifier 210. When a negative input signal is present at the input 209 of the amplifier 210, the output at lead 215 is +0.7 volts and no current flows through the resistor 223. In this instance, the magnitude of the voltage signal appearing at the output 248 of the amplifier 212 is the ratio of the values of the resistors 225 connected between the output 248 and input 221 and the resistor 227 connected between the input 221 of amplifier 212 and the input 209 of the amplifier 210. When a positive voltage signal is present at the input 209 of amplifier 210, the input 221 of the amplifier 212 sums the current flowing through the resistors 223 and 227. The voltage output at lead 248 is defined as the value of resistor 225× the voltage at the input 209× the (1/resistor 223−1/resistor 227). Through the proper selection of the values of resistor 223 and resistor 227, the magnitude of the voltage at the output 248 becomes the absolute value of the voltage at the input 209 to the amplifier 210.

A capacitor 229 is connected between the output 248 and the input 221 of the amplifier 212 and provides a pure DC voltage output. For purposes of this disclosure, it is sufficient to state that the output voltage of the full wave precision AC-to-DC converter circuit is exactly proportional to the average value of the AC waveform input. The operation of precision AC-to-DC converters are well known to those skilled in the art and reference may be had to numerous text books and manufacturer's application data for additional details and a further understanding of the operation of such a circuit.

Because the oscillator transformer 12 has a very high Q, the waveform is nearly a pure sinusoid and as a result, the DC output of the AC-to-DC converter is also proportional to the RMS and to the peak values of the input waveform. The input to the AC-to-DC converter is obtained from the one end 60 of the winding 58 of the transformer 12 as disclosed above in conjunction with the description of the fault detection circuit of FIG. 2.

Turning now to the description of the operation of the oscillator control loop, a variable resistance potentiometer 201 is an operator adjustable control and is set so that the voltage developed across the wiper 214 to one end 216 connected to the ground reference potential 80 is set to a desired value ranging from zero (0) to +10 volts to produce a test voltage having the desired magnitude. The opposite end 218 of the potentiometer 201 is connected through a resistor 220 to the regulated +12 volt DC output lead 156. The voltage at the wiper 214 is coupled through a resistor 222 to the inverting input 224 of the operational amplifier 200 which is configured as a comparator. The voltage gain of the comparator 200 is set by the value of the resistors 226 and 228, the resistor 226 being connected from the output 230 of the comparator 200 to the inverting input 232 of the comparator 200. The output 230 of the comparator 200 is coupled through a resistor 234 to the emitter terminal of the transistor 202 which is configured as a common base amplifier. When the voltage at the output 230 of the comparator 200 changes to a positive value, the common base amplifier transistor 202 is biased to cut-off collector current. The collector of the common base amplifier 202 is connected to the base 236 of the darlington transistor 204 which permits the voltage at the base 236 to rise in potential to a voltage +1.2 volts greater than the voltage at its collector 238 due to the current flowing through the resistor 240 connected between the base 236 and the high positive DC voltage produced across the capacitor 198 as described above. Accordingly, transistor 204 and transistors 206 and 208 are biased to full conduction and as a result, substantially the full power supply voltage of +32 volts DC is applied to one end 29 of the inductor 30 of the oscillator. The +32 volt DC potential is supplied through resistor 242 connected between the emitter of the transistor 204 and the one end 29 of the inductor 30. Additionally, transistors 206 and 208 provide the +32 volts DC through resistors 244 and 246 respectively to the one end 29 of the inductor 30, the resistors 244 and 246 being connected to the respective emitter terminals of their associated transistors.

As the oscillations build up, sinusoidal AC voltages are generated in the windings of the transformer 12 including the winding 58 which is coupled to the precision AC-to-DC converter which in turn causes the output 248 of the operational amplifier 212 to change to a positive potential. The resulting current produced in the resistor 228 which has a value equal to the resistor 222, causes the amplifier comparator 200 to be brought into a balanced condition. The output 230 of the comparator 200 changes from a positive potential toward some negative value which causes the common base amplifier transistor 202 to begin to conduct thereby reducing the potential at its base and ultimately at the output of the transistors 206 and 208 which are coupled to the common base transistor 202 through the darlington transistor 204. The reduction in the output of the transistors 206 and 208 causes the amplitude of oscillators to decrease and reduces the value of the positive voltage at the output of the comparator 200. This sequence continues until such time as the voltage at the input of the comparator 200 is equal to the value selected by the potentiometer 201. The feedback control loop is prevented from oscillating by the series resistor 250 and the capacitor 252 which series combination is connected between the output 230 and the input 232 of the comparator 200.

The respective emitters of the oscillator transistors 24 and 26 are connected together and emitter current flows in the lead 254 through a four terminal resistor 256 to the ground reference potential 80. An operational amplifier 258 has a non-inverting input 260 connected through a resistor 262 to one terminal 264 of the four terminal resistor 256. The inverting input 266 of the operational amplifier 258 is connected through the resistor 268 to a second terminal 270 of the four terminal resistor 256. The input terminal 272 of the four terminal resistor 256 is connected to lead 254 and the fourth terminal 274 is connected to the ground reference potential 80. A resistor 276 is connected between the output 278 of the amplifier 258 and the inverting input 266 and which resistor 276 determines the gain of the amplifier. The voltage at the output 278 of the amplifier 258 becomes positive as the oscillator current increases. The output 278 is coupled to the base 280 of a transistor 282 through a resistor 284 and a diode 286. When the output voltage of the amplifier 258 reaches approximately +10 volts, which output voltage corresponds to the maximum allowable oscillator current, the diode 286 becomes conductive to cause the base 280 of the transistor 282 to become positive causing the transistor 282 to become conductive. The collector 288 of the transistor 282 is connected to the non-inventing input 224 of the comparator 200 and clamps the positive input of the comparator 200 to ground potential which in turn reduces the voltage supplied to the oscillator. Since the voltage supplied to the oscillator is reduced, the oscillator current accordingly is reduced so that the control loop functions as a current regulator rather than a voltage regulator. The importance of this circuit is better appreciated when it is realized that this circuit prevents damage to the oscillator when losses in the insulated conductor under test are excessive or if bare wire in the electrode causes oscillators to cease.

When the AC power is initially supplied to the apparatus, the control loop does not immediately stabilize and during this time interval, it is possible for the oscillator to generate a voltage at the test electrode which greatly exceeds the preset, desired value. In order to prevent the possibility of providing an excess voltage at the test electrode, the circuit is soft-started. A capacitor 290 has one end connected to −12 volts DC on the lead 168 and has its opposite end 292 connected to the cathode of a diode 294. The anode of the diode 294 is connected to the junction of the collector 288 of transistor 282 and inverting input 224 of the comparator 200. Upon start-up, the diode 294 and capacitor 290 function to bring the control loop voltage up to the preset value over a period of several milliseconds. A resistor 296 is connected in parallel with the diode 294 and functions to provide a discharge path for the capacitor 290 when power is removed from the apparatus.

In instances where the power supply is providing a small current and the AC power is removed from the apparatus, the charge on the capacitor 138 is of sufficient magnitude to maintain the high voltage on the test electrode 104 for ten seconds or more after the AC power is removed. It is readily recognized that this is a dangerous condition which could impart harm or injury to an operator inadvertantly contacting the test electrode or conductor during this interval. In order to prevent such an injury from occurring due to the charge maintained on the capacitor 138 after power shut-down, the base 236 of the darlington transistor 204 is clamped to ground potential as soon as the −12 volt DC supply drops to approximately −10 volts. The base 236 of the darlington transistor 204 is connected to the collector of transistor 298 and which transistor 298 has its emitter terminal connected to ground reference potential 80. The base 300 of the transistor 298 is connected to the junction formed by one end of a resistor 302 connected to ground reference potential and the cathode of a diode 304. The anode of the diode 304 is connected to the cathode of the zener diode 176 and to one end of a resistor 306, the opposite end of the resistor 306 being connected to the lead 146 and one end of the capacitor 138. When AC power is removed, the −12 volt supply starts to drop and upon reaching approximately −10 volts, the diode 176 becomes non-conductive. The transistor 298 is now forward biased due to the charge on the capacitor 138 coupled to the base 300 of the transistor 298 through the diode 304 and the resistor 306. Accordingly, the high test voltage is removed from the electrode 104 within a fraction of a second since the clamping of the base 236 of the darlington transistor 204 to the ground reference potential removes DC power from the oscillator thereby causing the oscillator to cease functioning and generating the high voltage.

Considering further the discussion of the fault detector circuit of FIG. 2 above and as illustrated in FIG. 4, it will be recalled that the fault detector rides positive peaks of the AC signal output waveform and produces a positive output voltage signal only upon the occurrence of an arc fault in the electrode. The output signal is coupled to the base 308 of transistor 310 which causes the transistor 310 to become conductive. The collector of transistor 310 is connected to the base 312 of transistor 314 which has its emitter terminal connected to the +12 volt DC supply through a resistor 316 and to the ground reference potential through the resistor 318. The collector terminal of the transistor 314 is coupled to the base 320 of a transistor 322 through a resistor 324 and to the ground reference potential through a resistor 326. When the transistor 310 becomes conductive, the transistor 314 also becomes conductive which causes the voltage potential at its collector terminal to become a maximum positive voltage potential. The collector terminal of the transistor 314 is also connected to one end of a capacitor 328 and to the anode of a diode 330. The opposite end 332 of the capacitor 328 is connected to the base 334 of a darlington transistor 336 and to one terminal 338 A-G of switches 340 A-G, respectively. Each of the switches 340 A-G has one terminal 342 A-G connected to one respective end of an associated resistor 344 A-G. When the transistor 314 becomes conductive, the capacitor 328 begins to charge through one or more of the resistors 344 A-G depending upon the which of the respective switches 342 A-G are operated and which charging current develops a positive voltage at the base 334 of the transistor 336.

The transistor 336 becomes conductive and collector current flows from the collector terminal of the transistor 336 to the base 312 of the transistor 314 thereby augmenting the base current of transistor 314. The fault detector circuit remains in this state beyond the presence of the initial fault signal until such time as the base voltage on transistor 336 decreases in magnitude below approximately 1.2 volts which magnitude is reached when capacitor 328 completes its charge. The time interval during which the fault circuit remains in this state is determined by the setting of the switches 340 A-G. At the end of the time interval the transistor 336 becomes non-conductive and assuming that the transistor 310 is also non-conductive, transistor 314 becomes non-conductive and the voltage potential at its collector terminal drops to zero. Accordingly, it will be recognized that the positive voltage signal pulse produced at the collector of the transistor 314 has a minimum time duration which is determined by the settings of switches 340 A-G.

A digitial event counter generally designated 346 is driven from an emitter follower transistor amplifier and has an input 348. The emitter follower transistor amplifier is driven from the collector transistor 314 and has its base 320 coupled through resistor 324 to receive the positive pulse generated at the collector of transistor 314. A pulse is produced at the emitter of the transistor 322 and which emitter is connected to the input 348 of the digital event counter 346. The counter is incremented each time a pulse is produced. The collector of transistor 314 is also coupled through diode 330 to capacitor 350, the series resistor combination of resistor 352 and variable resistance 354 and to the base 356 of the darlington transistor 358. When the transistor 314 becomes conductive, collector current flows through the diode 330 to charge the capacitor 350 at the beginning of the positive voltage pulse signal produced when a fault is detected. The emitter 360 of the transistor 358 is connected to the base 362 of darlington transistor 364 through a resistor 366. When the potential at the emitter 360 of the transistor 358 becomes positive, transistor 364 changes to a conductive state. The collector of the transistor 364 is connected to one side 368 of a relay 370 through a resistor 372. The other side 374 of the relay 370 is connected to the lead 146 carrying the +32 volt DC power supply voltage. The collector of transistor 364 is also connected to the base 376 of a transistor 378 through a resistor 380. When transistor 364 becomes conductive, the relay 370 is energized and the transistor 378 becomes non-conductive. The collector of the transistor 378 is also connected to one side 382 of a switch 384 the opposite side 386 of which is connected through a resistor 388 to the base 362 of the transistor 364. The collector of transistor 378 is also connected to one side 389 of a reset switch 390 the opposite side 392 of which is connected to the ground reference potential. When the switch 384 is in its open position as illustrated in FIG. 4, the relay 370 will remain energized for the summation of the time duration of the collector pulse generated by the transistor 314 and the time required to discharge the capacitor 350 through the series resistance network comprising resistors 352 and 354. When the switch 384 is in its closed position, that is, contact is made between its ends 382 and 386, the relay 370 will remain energized until such time as the momentary operated switch 390 is operated. The relay 370 further has three sets of transfer contacts generally designated 394, 396 and 398. The transfer contacts may be wired in conjuction with additional equipment to provide alarm signals or to remove power from other machinery and the like in response to the detection of a fault.

The switches 340 A-G may be set in accordance with a very short voltage pulse signal at the collector of the transistor 314, for example, approximately one millisecond. The digital event counter 346 can therefore be made to respond to very closely spaced insulation faults in an insulated conductor 102 which is moving through the electrode 104 at a very high speed. It will be recognized that it is neither possible nor desirable for the relay 370 to respond to each of these rapidly occurring faults and the variable resistance 354 may be adjusted to change the time interval for which the relay 370 is energized after detection of the first insulation fault in a series of insulation faults.

As mentioned above, when a bare wire is present in the electrode 104, oscillations will cease and no output voltage signal is obtained from the fault detector. In this case, the output 278 of the operational amplifier 258 is at a maximum positive value of approximately +10 volts DC while the output 248 of the AC-to-DC converter drops to zero which is representative of the condition wherein there is no AC output test voltage. Since the output 248 of the AC-to-DC converter is connected to the base 400 of the transistor 402 through a resistor 404, the transistor 402 becomes non-conductive and the voltage potential on its collector terminal increases to a positive voltage value and which voltage is coupled to the base 308 of transistor 310 through a diode 406 in series with the collector of the transistor 402 and the base 308. When the collector of transistor 402 rises towards a positive DC voltage value, the diode 406 becomes conductive causing the base 308 of transistor 310 to become conductive thereby causing the transistor 310 to become conductive turning on the transistor 314 and causing the voltage at its collector to become positive and remain positive during the time within which the bare wire condition persists. The digital event counter 346 will register a single fault and the relay 370 will remain in its energized state for the duration of the presence of the bare wire condition in the electrode 104.

In order to prevent the fault circuit from erroneously being triggered by transient conditions when power is first applied to the testing apparatus, a transistor 407 is connected such that its collector terminal is connected to the base 312 of transistor 314 and having its emitter terminal connected to the +12 volt DC supply. The base 408 of the transistor 407 is connected to the ground reference potential through a resistor 410 which provides base current to cause the transistor 407 to become conductive and clamp the base 312 of the transistor 314 to the +12 volt DC supply potential thereby insuring that the transistor 314 remains in its non-conductive state during start-up. A capacitor 411 is coupled to the base 408 through a resistor 412 and to the +32 volt DC voltage supply through a resistor 414. The capacitor 411 charges through the resistor 414 until such time as the current flowing through the resistor 412 causes the base 408 of the transistor 407 to become more positive than its emitter and causing the transistor 407 to be non-conductive. During the charging interval of capacitor 411, the transistor 314 is prevented from switching to its conductive state and accordingly, no fault indication signal can be generated or registered by either the digital event counter 346 or the output relay 370.

Apparatus for testing and counting flaws in the insulation of an electrical conductor passing through an electrode has been described above in a preferred embodiment. It will be recognized the numerous changes and modifications may be made to the values of the various circuit components and also to the configuration of the functioning circuits without departing from the scope of the invention. Therefore, the invention has been described by way of illustration rather than limitation.

I claim:

1. Apparatus for testing the insulation on an insulated conductor and for use with an electrode through which the conductor is passed with a continuous motion and adapted to apply a high test voltage to the portion of such insulation instantaneously received therein, said apparatus comprising:

oscillator circuit means for producing a high frequency sinusoidal test voltage for transmission to the electrode, said oscillator circuit means further defining a linear oscillator comprising at least two semiconductor switching devices connected in a "push-pull" operating mode and coupled to a center-tapped primary winding of transformer circuit means for producing the high frequency test voltage, said center-tapped primary winding having two ends each respective one of which is coupled to a respective one of said at least two semiconductor switching devices, inductive circuit mean coupled to the center tap of said primary winding for absorbing the difference in the waveform signals produced by said at least two semiconductor switching devices causing a sinusoidal waveform signal to be impressed across said center-tapped primary winding;

controller circuit means coupled to said oscillator circuit means for adjusting and maintaining the magnitude of said alternating test voltage at a present desired voltage, and circuit means coupled to said oscillator circuit means for measuring the magnitude of said alternating test voltage to produce an error signal representative of the difference between said desired value and said measured magnitude;

said controller circuit means being coupled to said test voltage measuring circuit means and being responsive thereto to adjust the magnitude of said alternating test voltage produced by said oscillator circuit means, said controller circuit means further defining an oscillator control loop circuit means for generating an oscillator control loop voltage and being coupled to said at least two semiconductor switching devices through said inductive circuit means for providing a biasing voltage to said semiconductor switching devices to cause said oscillator circuit means to produce said waveform signal across said center-tapped primary winding at a magnitude to cause said alternating test voltage to maintain a desired preset magnitude, said biasing voltage being proportional and directly related to said oscillator control loop voltage.

2. Insulating testing apparatus as defined in claim 1 further comprising:

fault detection circuit means coupled to said test voltage oscillator circuit producing means for detecting a fault signal when a fault condition is present on the insulated conductor portion within the electrode, said fault signal being generated when said alternating test voltage arcs to the wire conductor through a flaw in the insulation of said conductor and appearing as a series of fast-rise pulses superimposed on the peaks of said alternating test voltage.

3. Insulation testing apparatus as defined in claim 2 wherein said fault detection circuit means further comprises:

negative threshold voltage generating circuit means for producing a voltage having a negative magnitude whereby the peaks of said alternating test voltage signal ride on said negative threshold value, and positive peak conducting rectifier circuit means for rectifying said positive portion of said fault signal exceeding said negative threshold to produce a fault present voltage pulse signal, said negative threshold magnitude being set such that the magnitude of said fault signal contains a positive excursion only during the time of a fault condition.

4. Insulation testing apparatus as defined in claim 3 further comprising circuit means for generating a pulse voltage count signal in response to said fault present voltage pulse signal, said count signal generating circuit means further including circuit means for preventing the generation of a count signal when A.C. power is initially applied to said apparatus.

5. Insulation testing apparatus as defined in claim 1 further comprising:

current sensing circuit means coupled to said oscillator circuit means for sensing the electrical current being consumed in the production of said alternating test voltage, said current sensing circuit means producing an output voltage signal when said current exceeds a predetermined threshold, said controller circuit means being coupled to said current sensing circuit means and responsive to said output voltage signal whereby said oscillator circuit means is inhibited to prevent damage to circuit component elements comprising said oscillator circuit means.

6. Insulation testing apparatus as defined in claim 1 further comprising shut-down circuit means coupled to said controller circuit means for causing said oscillator circuit means to cease production of said-alternating test voltage substantially instantaneously upon the disconnection of A.C. power from said testing apparatus thereby removing said test voltage from the electrode.

7. Insulation testing apparatus as defined in claim 1 further including start-up circuit means coupled to said controller circuit means for causing said oscillator circuit means to gradually increase the magnitude of said alternating test voltage to a desired preset value upon the connection of A.C. power to said testing apparatus whereby the magnitude of said alternating test voltage applied to the electrode is limited during the start-up period.

8. Insulation testing apparatus as defined in claim 1 wherein said test voltage measuring circuit means comprises a full wave precision AC-to-DC converter for providing a DC output voltage having a magnitude proportional to and representative of the magnitude of said test voltage.

* * * * *